United States Patent
Wang et al.

(10) Patent No.: US 10,187,008 B2
(45) Date of Patent: *Jan. 22, 2019

(54) DOUBLE-GLASS PHOTOVOLTAIC MODULE

(71) Applicant: BYD COMPANY LIMITED, Shenzhen (CN)

(72) Inventors: Shencun Wang, Shenzhen (CN); Xiang Sun, Shenzhen (CN); Shengya Wang, Shenzhen (CN); Zhanfeng Jiang, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 115 days.

This patent is subject to a terminal disclaimer.

(21) Appl. No.: 15/107,557

(22) PCT Filed: Aug. 15, 2014

(86) PCT No.: PCT/CN2014/084537
§ 371 (c)(1),
(2) Date: Jun. 23, 2016

(87) PCT Pub. No.: WO2015/096489
PCT Pub. Date: Jul. 2, 2015

(65) Prior Publication Data

US 2016/0315581 A1 Oct. 27, 2016

(30) Foreign Application Priority Data

Dec. 27, 2013 (CN) .......................... 2013 1 0737581

(51) Int. Cl.
*H02S 40/34* (2014.01)
*H02S 30/10* (2014.01)
(Continued)

(52) U.S. Cl.
CPC ............ *H02S 40/34* (2014.12); *H01L 31/044* (2014.12); *H01L 31/0488* (2013.01); *H02S 30/10* (2014.12); *Y02E 10/50* (2013.01)

(58) Field of Classification Search
CPC .......................... H01L 31/0488; H02S 30/10
See application file for complete search history.

(56) References Cited

U.S. PATENT DOCUMENTS 4,097,309 A 6/1978 Horne
2010/0065108 A1* 3/2010 West ...................... F24S 25/20
136/251
(Continued)

FOREIGN PATENT DOCUMENTS

CN 201075859 Y 6/2008
CN 201498522 U 6/2010
(Continued)

OTHER PUBLICATIONS

Qin et al, CN 102237423 A, English machine translation, pp. 1-18.*
(Continued)

*Primary Examiner* — Tae-Sik Kang
(74) *Attorney, Agent, or Firm* — Anova Law Group, PLLC

(57) ABSTRACT

A double-glass photovoltaic module includes: a body, where the body includes a first glass layer, a first encapsulation layer, a cell group layer, a second encapsulation layer, and a second glass layer that are sequentially disposed in a laminated manner, the cell group layer extracts a current by using a bus bar, and the bus bar is led out between the first glass layer and the second glass layer and from an edge of the body; a frame, encapsulated at a periphery of the body by a sealant and having a notch; and a connection box,
(Continued)

disposed at the notch, and sealed and connected to the body the frame, and the bus bar is electrically connected to the connection box.

17 Claims, 5 Drawing Sheets

(51) Int. Cl.
*H01L 31/044* (2014.01)
*H01L 31/048* (2014.01)

(56) References Cited

U.S. PATENT DOCUMENTS

| | | | |
|---|---|---|---|
| 2010/0147364 A1* | 6/2010 | Gonzalez | H01L 31/02021 136/251 |
| 2011/0011641 A1* | 1/2011 | Pfeffer | H05K 7/20409 174/547 |
| 2011/0036390 A1* | 2/2011 | Nelson | B32B 17/10614 136/251 |
| 2012/0222726 A1 | 9/2012 | Qin | |
| 2013/0008482 A1* | 1/2013 | Stancel | H01L 31/05 136/244 |
| 2013/0323874 A1 | 12/2013 | Furihata et al. | |

FOREIGN PATENT DOCUMENTS

| | | | |
|---|---|---|---|
| CN | 201868452 U | | 6/2011 |
| CN | 102237423 A | * | 11/2011 |
| CN | 102916068 A | | 2/2013 |
| CN | 202948949 U | | 5/2013 |
| CN | 103165705 A | | 6/2013 |
| CN | 203013755 U | | 6/2013 |
| CN | 203746872 U | | 7/2014 |
| CN | 203746873 U | | 7/2014 |
| CN | 203774347 U | | 8/2014 |
| DE | 20117716 U1 | | 3/2002 |
| EP | 1763088 A1 | | 3/2007 |
| JP | 2011109051 A | | 6/2011 |
| WO | 2009106698 A1 | | 9/2009 |
| WO | 2013081356 A1 | | 6/2013 |
| WO | 2013086265 A1 | | 6/2013 |

OTHER PUBLICATIONS

The World Intellectual Property Organization (WIPO) International Search Report for PCT/CN2014/084537 Oct. 31, 2014.

* cited by examiner

US 10,187,008 B2

DOUBLE-GLASS PHOTOVOLTAIC MODULE

CROSS-REFERENCE TO RELATED APPLICATION

This application is a national phase entry under 35 U.S.C. § 371 of International Application No. PCT/CN2014/084537, filed on Aug. 15, 2014, which claims the priority to and benefits of Chinese Patent Application No. 201310737581.2 filed with the State Intellectual Property Office of the People's Republic of China (SIPO) on Dec. 27, 2013, the content of all of which is incorporated by reference herein in entirety.

TECHNICAL FIELD

The present disclosure relates to the field of solar cells and, in particular, to a double-glass photovoltaic module.

BACKGROUND

In a long process of using a photovoltaic module for tens of years, there are often various opaque objects falling or stuck to the front of the module. Once there is a foreign matter, a hot-spot effect occurs. In this case, a diode of a protection component is conducted, a current flows through the diode, and heat is generated. As such a case occurs frequently, the diode is probably invalid before a warranty period ends. In this case, a function of protecting the module against the hot-spot effect is invalid, and the entire power station is endangered. Moreover, for a double-glass module, because glass is used at the back and edges have favorable sealing performance, a service life of the module can be prolonged to more than 40 years, but it is difficult for a connection box with a plastic base material to reach such a target service life. This problem can be resolved in two manners: change the material of the connection box, which inevitably causes a great increase in costs; or replace the connection box before a design life of the connection ends or when the connection box is invalid during use.

In the structure of a current connection box, a diode, a bus bar, and a conductive block are all immersed in solidified potting glue, to replace the connection box, the potting glue in the connection box needs to be removed and cleaned up. In this way, on the one hand, the bus bar may be broken off, and the potting glue on the bus bar is difficult to be removed, resulting in difficult welding of the bus bar or false welding when a new connection box is disposed, having great potential risks; on the other hand, a great deal of manpower and time needs to be consumed to replace the connection box, causing unnecessary waste. A defect in design of such a connection box is that the bus bar is located exactly above a leading leg of the diode, and the diode may be welded off or false-welded due to melting of a tin solder when the bus bar is welded, which easily causes a production defect.

SUMMARY

An objective of the present disclosure is to resolve at least one of the technical problems in the prior art. Therefore, an objective of the present disclosure is to provide a double-glass photovoltaic module.

A connection box for a double-glass photovoltaic module according to embodiments of the present disclosure includes: a body, including a first glass layer, a first encapsulation layer, a cell group layer, a second encapsulation layer, and a second glass layer that are sequentially disposed in a laminated manner, where the cell group layer extracts a current by a bus bar, and the bus bar is led out between the first glass layer and the second glass layer and from an edge of the body; a frame, encapsulated at a periphery of the body, and having a notch; and a connection box, disposed at the notch, sealed and connected to the body and the frame, and the bus bar is electrically connected to the connection box.

In the double-glass photovoltaic module according to the present disclosure, a bus bar can be effectively led out from an edge of a body by a frame. Moreover, by means of disposing the frame, when edges or four corners of a cell module are impacted by external force, a first glass layer and a second glass layer of the body can be prevented to the greatest extent from being smashed, thereby protecting the cell module, making it convenient for transportation, and making a service life longer.

Some of additional aspects and advantages of the present disclosure will be provided in the following descriptions, and some will become obvious in the following descriptions, or be learned from practice of the present disclosure.

BRIEF DESCRIPTION OF THE DRAWINGS

The foregoing and/or additional aspects and advantages of the present disclosure will become obvious and easy to understand in the following descriptions of the embodiments with reference to the following accompanying drawings.

DETAILED DESCRIPTION

The following describes in detail embodiments of the present disclosure. Examples of the embodiments are shown in the accompanying drawings, where reference signs that are the same or similar from beginning to end represent same or similar components or components that have same or similar functions. The following embodiments described with reference to the accompanying drawings are exemplary, which are used only to explain the present disclosure, and cannot be construed as a limitation to the present disclosure.

In the descriptions of the present disclosure, it should be understood that orientations or position relationships indicated by terms such as "in the center of" "above", "below", "top", "bottom", "inside", and "outside" are orientations or position relationships indicated based on the accompanying drawings, and are used only for ease of describing the present disclosure and of simplified descriptions rather than for indicating or implying that an apparatus or a component must have a particular orientation or must be constructed or operated in a particular orientation, and therefore, cannot be construed as a limitation to the present disclosure. In addition, terms "first" and "second" are used only for describing objectives, and shall not be construed as indicating or implying relative importance or implying a quantity of indicated technical features. Therefore, a feature restricted by "first" or "second" may explicitly indicate or implicitly include one or more such features. In the descriptions of the present disclosure, unless otherwise provided, "multiple" means two or more than two.

In the description of the present disclosure, it should be noted that, unless otherwise explicitly stipulated and restricted, terms "installation", "joint connection", and "connection" should be understood broadly, which, for example, may be a fixed connection, or may be a detachable connection, or an integral connection; or may be a mechanical connection, or may be an electrical connection; or may be a direct connection, or may be an indirect connection by using a medium, or may be an internal communication between two components. A person of ordinary skill in the art can understand specific meanings of the foregoing terms in the present disclosure according to a specific situation.

The following describes a double-glass photovoltaic module according to the embodiments of the present disclosure with reference to FIG. 1 to FIG. 12.

The double-glass photovoltaic module according to an embodiment of the present disclosure includes a body 1, a frame 6, and a connection box 4.

Figure 1:
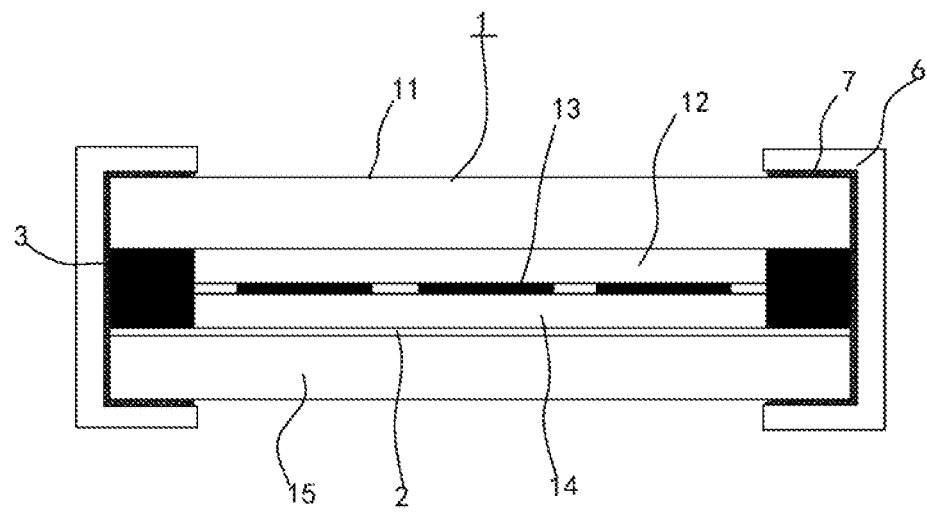
FIG. 1 is a sectional view of a double-glass photovoltaic module according to an embodiment of the present disclosure.

As shown in FIG. 1, the body 1 includes a first glass layer 11, a first encapsulation layer 12, a cell group layer 13, a second encapsulation layer 14, and a second glass layer 15 that are sequentially disposed in laminated manner, where outer edges of the first glass layer 11 and the second glass layer 15 exceed outer edges of the first encapsulation layer 12, the cell group layer 13, and the second encapsulation layer 14. Optionally, the first glass layer 11 may be common low iron ultra-white patterned tempered glass or film coated low iron ultra-white patterned tempered glass, and the second glass layer 15 may be common low iron ultra-white patterned tempered glass or common tempered glass. By using the first glass layer 11 and the second glass layer 15, strength of the body 1 is enhanced, and a capability of the body 1 for load bearing is improved. Glass has extremely superior weather resistance, ageing resistance, insulation resistance, and fire resistance performance, and abrasion resistance of glass is greatly higher than a backplane of polymers. Therefore, using glass as a backplane can well enhance ageing resistance performance of a cell module, and pressure resistance and fire resistance performance of the double-glass photovoltaic module according to the present disclosure are also improved.

The frame 6 is encapsulated at a periphery of the body 1 by using a sealant. Optionally, the frame is fastened to an outside of an outer edge of the body 1 by using silica gel, butyl rubber, or a double faced adhesive tape. The frame 6 has a notch 60, the connection box 4 is disposed at the notch 60, the connection box 4 is sealed and connected to the body 1 and the frame 6, the cell group layer 13 leads out a bus bar 131 between the first glass layer 11 and the second glass layer 15, and the connection box 4 is electrically connected to the bus bar 131 to extract energy of a cell.

In the double-glass photovoltaic module according to the present disclosure, the bus bar 131 can be effectively led out from the edge of the body by using the frame 6. Moreover, by means of disposing the frame, when edges or four corners of the cell module are impacted by external force, the first glass layer 11 and the second glass layer 15 of the body 1 can be prevented to the greatest extent from being smashed, thereby protecting the cell module, making it convenient for transportation, and making a service life longer.

The double-glass photovoltaic module according to an embodiment of the present disclosure further includes a reflecting coating 2 and an end part sealing block 3.

The reflecting coating 2 is provided on a side surface (a lower surface shown in FIG. 1 and FIG. 5), facing the cell group layer 13, of the second glass layer 15. Optionally, the reflecting coating 2 is in a flat network shape, and the first glass layer 11 is frosted glass.

The end part sealing block 3 is disposed between the first glass layer 11 and the second glass layer 15, and the end part sealing block 3 is located at peripheries of the first encapsulation layer 12/the cell group layer 13/the second encapsulation layer 14. Specifically, the double-glass photovoltaic module is made by laminating the first glass layer 11, the first encapsulation layer 12, the cell group layer 13, the second encapsulation layer 14, the second glass layer 15, and the end part sealing block 3. A symbol "/" used in the descriptions of the present disclosure indicates "and".

In the double-glass photovoltaic module according to the present disclosure, with the use of the end part sealing block, the disadvantage of the conventional photovoltaic module at which edge encapsulation materials are exposed may be overcome. Further, in a compact combination of the first glass layer and the second glass layer, water vapor and a corrosive gas in the environment can be well prevented from entering the module, attenuation of the module is slowed down, and a service life of the module is prolonged. By means of disposing a reflecting coating, a light running through a gap between cells can be reflected back to reduce encapsulation loss.

Figure 5:
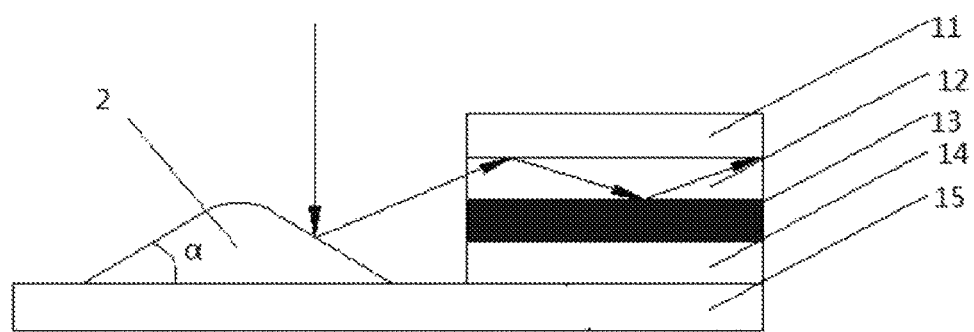
FIG. 5 is a light reflection principle diagram of a backplane layer in the double-glass photovoltaic module shown in FIG. 1.

According to some embodiments of the present disclosure, as shown in FIG. 5, a cross section of the reflecting coating 2 is substantially of a triangular shape with a vertex angle being a circular arc, and the reflecting coating 2 is disposed corresponding to the gap between adjacent cells and/or an edge of a cell of the cell group layer 13. Therefore, referring to FIG. 5, a light running from the first glass layer 11 to the gap between cells is reflected at the reflecting coating 2 of a triangle with a circular arc vertex angle. Then the light is incident to the first glass layer 11, and continues to be reflected to a cell for use. In this way, quantum of light utilization is further improved, and output power of the cell module is improved. In addition, in a lamination process, the reflecting coating 2 of the triangle with the circular arc vertex angle may not cause damage to the edge of the cell and the encapsulation film, and may be well fitted within the cell module, thereby increasing security and mechanical stability of the cell module, and prolonging the service life.

In some embodiments, the reflecting coatings disposed corresponding to the gap between the adjacent cells in the cell group layer 13 and/or the edge of a cell may be of an integrated network board structure.

Optionally, a curvature of the vertex angle of the triangle of the cross section of the reflecting coating 2 is Π/6-5Π/6. Further, the curvature of the vertex angle of the triangle is Π/4-Π/2. More preferably, the curvature of the vertex angle of the triangle is Π/3. Optionally, a bottom angle α of the triangle of the cross section of the reflecting coating 2 is 15-85 degrees. Further, the angle of the bottom angle α of the triangle is 30-70 degrees. More preferably, the angle of the bottom angle α of the triangle is 60 degrees. A person of ordinary skill in the art can understand that the curvature of the vertex angle and the angle of the bottom angle of the triangle described above can be used in any combination.

In some embodiments, the reflecting coating 2 is a white organic macromolecule layer, including but not limited to at least one selected from: a fluorocarbon resin layer, a diallyl isophthalate layer, a polyvinylidene fluoride layer, a polyethylene layer, a polytetrafluoroethylene layer, a fluorocarbon resin modified polymer layer, a diallyl isophthalate modified polymer layer, a polyvinylidene fluoride modified polymer layer, a polyethylene modified polymer layer, or a polytetrafluoroethylene modified polymer layer, which has features such as high reflectivity and excellent aging resistance performance. The reflecting coating 2 is closely adhered to a surface of a transparent layer by using processing processes including but not limited to spray coating, coating, and printing.

Figure 2:
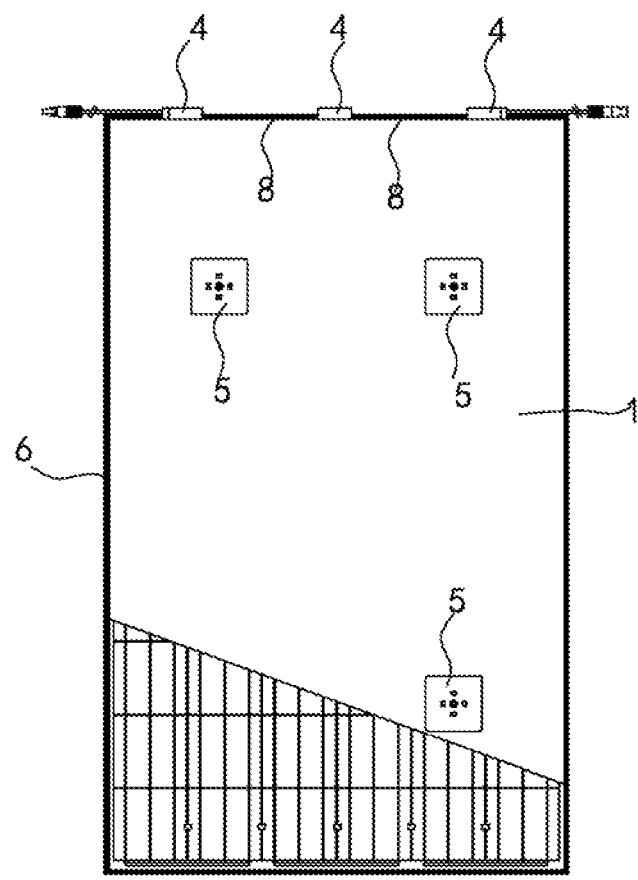
FIG. 2 is a schematic view of the double-glass photovoltaic module shown in FIG. 1.

According to an embodiment of the present disclosure, as shown in FIG. 2, the body 1 and the frame 6 are formed as rectangles, and the notch is provided on a short side of the frame. Multiple connection boxes 4 are provided, spaced from one another and disposed on a short side of the body 1. For example, description is provided below by using an example in which three connection boxes 4 are provided. Every two adjacent connection boxes 4 are connected by using an encapsulation connector 8, and the encapsulation connector 8 encapsulates the outer edge, corresponding to the notch 60, of the body 1. Therefore, the encapsulation connector 8 and the frame 6 jointly protect edges of the body 1. In comparison, generally, edges of a conventional cell module are not protected or are only protected by using an adhesive tape. A module of such a structure has low security and great risks during transportation and installation because edges and sides of tempered glass would be easily stressed and cracked. However, with the double-glass photovoltaic module according to the embodiments of the present disclosure using a rigid U-shaped frame and the encapsulation connector 8, impact resisting capabilities of the edges and corners of the cell module are greatly improved, and a sealing effect of the cell module is further enhanced.

In some embodiments, the frame 6 and the encapsulation connector 8 may be made of multiple types of materials respectively. In one embodiment, the frame 6 is an aluminum part, and the encapsulation connector 8 is an insulator. In this case, the frame 6 needs to be provided with a grounding hole 64. In another embodiment, the frame 6 and the encapsulation connector 8 are both aluminum parts, and each encapsulation connector 8 between every two adjacent connection boxes 4 may be provided with one grounding hole 64. Certainly, the present disclosure is not limited thereto. The frame 6 and the encapsulation connector 8 may both be insulators. In this case, neither the frame 6 nor the encapsulation connector 8 needs to be provided with a grounding hole 64.

Figure 8:
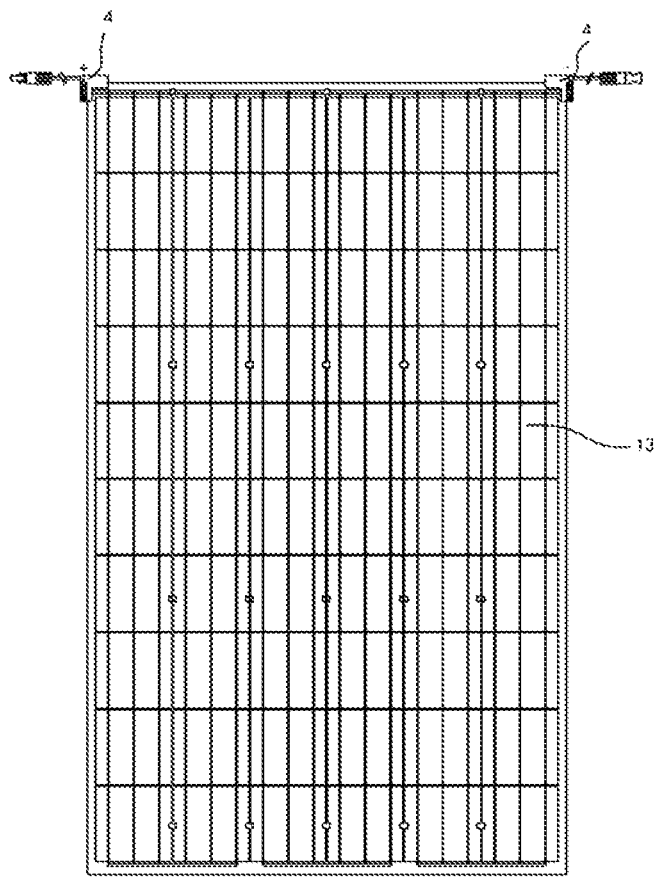
FIG. 8 is a schematic view of a double-glass photovoltaic module according to another embodiment of the present disclosure.

As shown in FIG. 2 and FIG. 8, the connection box 4 is clamped to the outer edge of the body 1, and is sealed and connected to the frame 6 by using a sealant. Therefore, the connection box 3 is installed at the edge of the cell module, instead of opening a hole or a groove at the back of the module, which maintains a complete structure of the second glass layer 15, does not form a focal point of stress, and has higher security. Moreover, compared with the conventional module, such a deployment of the connection box 3 can reduce lengths of the bus bar inside and a cable outside of the module, reduce costs, reduce resistance, and increase power output. Optionally, two clamping feet (not shown in the figure) are disposed at one side, facing the body 1, of the connection box 4, and the two clamping feet are separately clamped to the outer edge of the body 1. Further, in one embodiment, the connection box 4 is glued to the first glass layer 11 and the second glass layer 15 of the body 1.

Figure 6:
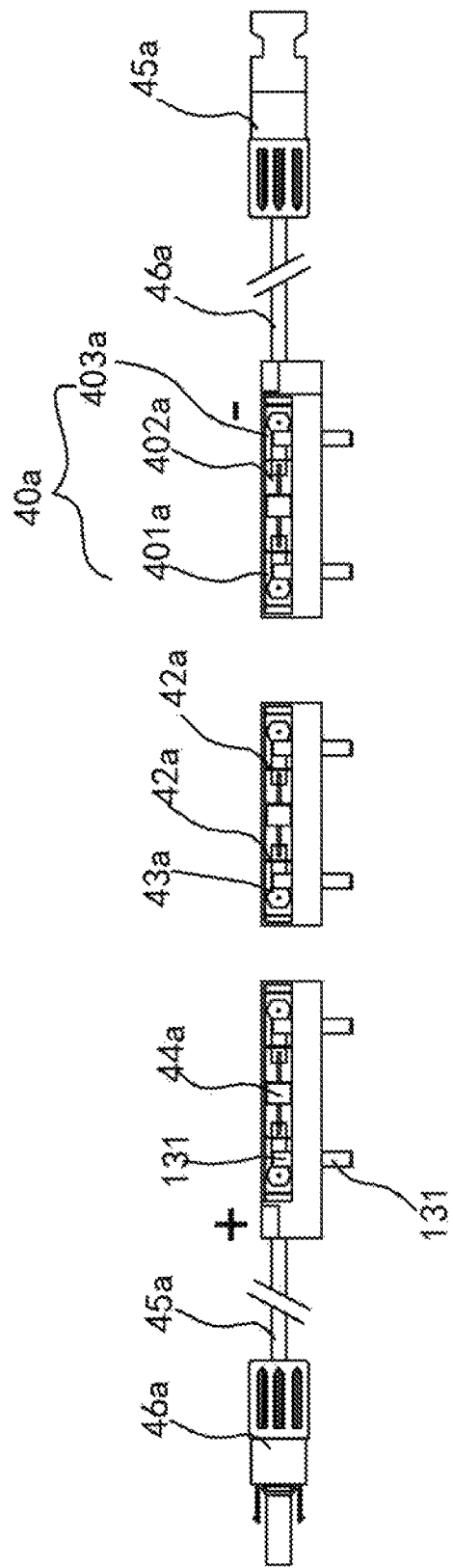
FIG. 6 is a schematic view of a connection box in a double-glass photovoltaic module according to an embodiment of the present disclosure.
Figure 7A:
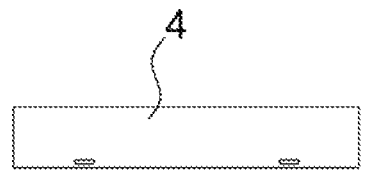
FIG. 7a and FIG. 7b are respectively a top view and a bottom view of a connection box shown in FIG. 1.
Figure 7B:
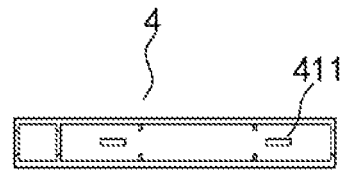

The following specifically describes a structure of the connection box 4 of this embodiment. The connection box 4 includes: a case 41a, at least two partition plates 42a, a conductive block 43a, a diode 44a, and a connector member 45a. As shown in FIG. 6, the case 41a has a chamber 410, and a side wall of the chamber 410 is provided with multiple threading holes 411. The bus bar 131 led out from the cell of the photovoltaic module is suitable for running through the threading hole 411 to enter the chamber 410, as shown in FIG. 6 and FIG. 7b. The at least two partition plates 42a are disposed inside the chamber 410 to divide the chamber 410 into at least three sub-chambers. For example, the partition plate 42a may be a plastic part. The threading holes 411 are formed on side walls of two outermost sub-chambers of the at least three sub-chambers. Optionally, the threading hole 411 is a rectangular hole, as shown in FIG. 7b.

The conductive block 43a is disposed inside the chamber 410 and runs through the at least three sub-chambers, which prolongs a length of the conductive block 43a. The bus bar 131 is suitable for being in welded connection with the conductive block 43a to extract energy of a cell. The diode 44a is disposed inside a middle sub-chamber of the at least three sub-chambers, so as to prevent the cell from burning out when a hot-spot effect occurs, and prevent a current from flowing backwards when there is no light. The diode 44a is electrically connected to the conductive block 43a, and preferably, the diode 44a is welded to the conductive block 43a. The connector member 45a is located outside of the case 41a and is connected to the conductive block 43a by a cable 46a.

Therefore, the connection box 4 according to this embodiment of the present disclosure includes the chamber 410, which is further divided into multiple sub-chambers by the partition plates 42a, the diode 44a is disposed inside the middle sub-chamber. When the bus bar 131 is being welded, a welding position of the diode 44a will not melt, which may prevent the diode from being welded off. Moreover, when the diode 44a or the connection box 4 is invalid, only the bus bar 131 needs to be welded off, or the bus bar 131 needs to be taken out from the threading hole 411, and then the connection box can be removed. Operations are convenient and time-saving, which is easy for power station maintenance, and prolongs a service life of the module. The double-glass photovoltaic module according to this embodiment of the present disclosure may further include a surface mount thin sheet diode 9. The thin sheet diode 9 is welded to the bus bar 131 and is laminated between the first glass layer 11 and the second glass layer 15, so as to prevent the cell from burning out when a hot-spot effect occurs, and prevent a current from flowing backwards when there is no light.

According to a preferable embodiment of the present disclosure, two partition plates 42a are provided, and the two partition plates 42a divide the chamber 410 into three sub-chambers, including a first sub-chamber 401a, a second sub-chamber 402a, and a third sub-chamber 403a. The diode 44a is disposed inside the middle sub-chamber 402a, as shown in FIG. 6. The sub-chamber in which the diode 44a is located is the second sub-chamber 402a, and is sealed by potting glue. Therefore, potting glue with favorable conductivity for heat can be kept around the diode 44a, which can promptly reduce a temperature of the diode, thereby protecting the diode. Optionally, the first sub-chamber 401a and the third sub-chamber 403a may remain empty, or may receive potting glue.

Optionally, the case 41a includes a box seat and a box cover (not shown in the figure) which are clamped to each other, and sealed together by butyl rubber, thereby ensuring water resistance of the connection box.

The following specifically describes an installation process of the connection box according to the embodiments of the present disclosure with reference to FIG. 6. Descriptions are provided by using an example in which the bus bar 131 is welded to the conductive block 43a.

As shown in FIG. 6, the bus bar 131 led out from the cell of the photovoltaic module runs through the threading hole 411 and extends into the first sub-chamber 401a and the third sub-chamber 403a. As shown in FIG. 6, when reserved tin solders in the first sub-chamber 401a and the third sub-chamber 403a are heated, the bus bar 131 is welded to the conductive block 43a. Finally, the potting glue is poured into the second sub-chamber 402a in which the diode 44a is located, thereby completing installation of the connection box.

With the connection box according to the embodiments of the present disclosure, some existing problems such as it is difficult to replace a connection box, and a diode is easily to be welded off when a bus bar is being welded, are resolved, and a service life may be prolonged, which can achieve an extremely long warranty period of 40 years.

Figure 9:
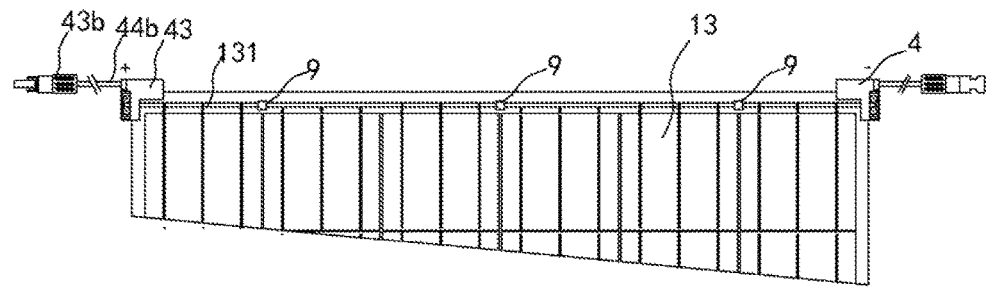
FIG. 9 is a partial enlarged view of the double-glass photovoltaic module shown in FIG. 8, showing assembling of a diode and a connection box therein.
Figure 10:
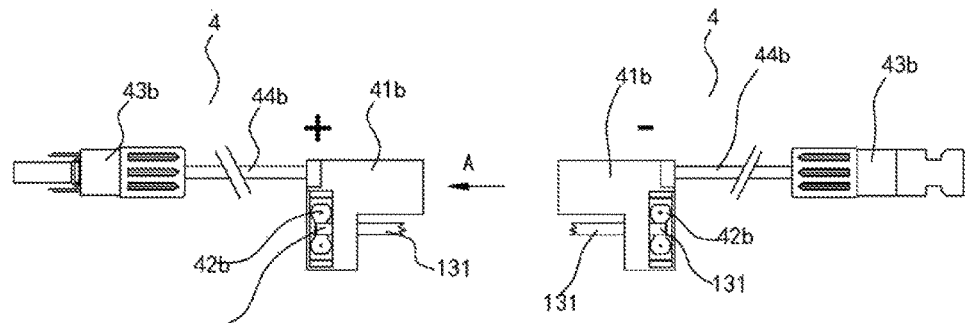
FIG. 10 is a schematic view showing that a positive connection box and a negative connection box are separately led out in the double-glass photovoltaic module shown in FIG. 9.
Figure 11:
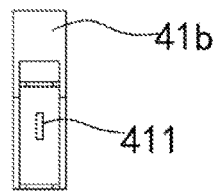
FIG. 11 is a side view along a direction A in FIG. 10.
Figure 12:
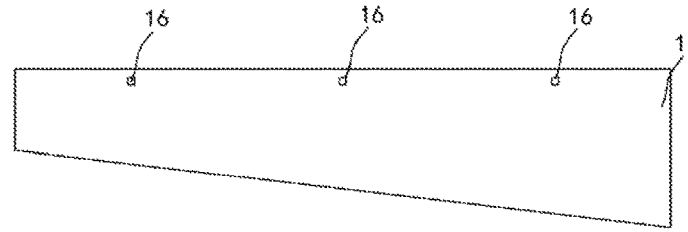
FIG. 12 is a schematic partial view of a second glass layer in the double-glass photovoltaic module shown in FIG. 9, showing a receiving groove therein.

As shown in FIG. 6, according to another embodiment of the present disclosure, the double-glass photovoltaic module includes a surface mount thin sheet diode 9. The thin sheet diode 9 is welded to the bus bar 131 and is laminated between the first glass layer 11 and the second glass layer 15, so as to prevent the cell from burning out when a hot-spot effect occurs, and prevent a current from flowing backwards when there is no light. In this case, two connection boxes 4 are provided, and each connection box is of an L shape. The two connection boxes 4 are disposed at two adjacent corners of the body 1, and the bus bar 131 extends into the connection box 4 to extract energy of the cell. Specifically, when a cell matrix in the cell group layer is laid, the thin sheet diode 9 is directly welded to the bus bar 131, the bus bar 131 is led out from two ends, and respectively welded to a positive connection box and a negative connection box disposed at two corners of the body 1, as shown in FIG. 8 to FIG. 10. Optionally, a length of a side of the thin sheet diode 9 is 8-12 mm.

In some embodiments, a material of the connection box 4 may be porcelain; therefore, tolerance to the environment can be improved. Certainly, the material of the connection box 4 may be plastic.

In one embodiment, a thickness H of the diode 9 is less than 0.8 mm; otherwise, the diode 9 may stand up to the first glass layer 11 and the second glass layer 15 that are located respectively above and below the diode 9. In another embodiment of the present disclosure, a thickness H of the diode 9 is 0.8-2 mm. In this case, a receiving groove 16 is formed on at least one of opposite side surfaces of the first glass layer 11 and the second glass layer 15, where a total depth h of the receiving groove 16 meets h=(H−0.8) mm. That is, if one of the first glass layer 11 and the second glass layer 15 is provided with a receiving groove 16, a depth h of the receiving groove meets h=(H−0.8) mm; if the first glass layer 11 and the second glass layer 15 each are provided with a corresponding receiving groove 16, the total depth h of the two receiving grooves meets h=(H−0.8) mm. Optionally, as shown in FIG. 6, the receiving groove 16 is formed on the second glass layer 15.

Preferably, the receiving groove 16 is a square groove, and a length of a side of the receiving groove 16 is 0.2 mm greater than a length of a side of the diode 9. In this way, the diode 9 is basically in close contact with the first glass layer 11 and the second glass layer 15 that are located respectively above and below the diode 9, so that heat generated by the diode 9 can be conducted out.

Specifically, the connection box 4 includes: a case 41b, a conductive sheet 42b, and a connector member 43b, where the case 41b has a chamber 410b, a side wall of the chamber 410b is provided with a threading hole 411b (as shown in FIG. 5). In some embodiments, the threading hole 11 is a rectangular hole. The conductive sheet 42b is disposed inside the chamber 410b, where the bus bar 131 runs through the threading hole 411b, extends into the chamber 410b, and is connected to the conductive sheet 42b, and the connector member 43b is located outside the case 41b and is connected to the conductive block by using a cable 44b. Optionally, the bus bar 131 and the conductive sheet 42b may be in welded connection or in clamped connection.

The double-glass photovoltaic module according to the embodiments of the present disclosure resolves existing problems that it is difficult to replace a connection box, and that a diode is easily welded off when a bus bar is welded, and prolongs a service life. Moreover, the connection box may be easily installed, and fewer cables and bus bars are required, thereby reducing resistance and increasing power output.

In the double-glass photovoltaic module according to some embodiments of the present disclosure, the end part sealing block 3 may be a butyl rubber member or a polyisobutylene rubber member, or an assembly glue member having a water vapor transmission rate lower than 0.01 g/m2/day, thereby making up a disadvantage of exposing encapsulation materials of edges of the conventional photovoltaic module. Further, in the compact combination of the first glass layer 11 and the second glass layer 15, water vapor and a corrosive gas in the environment can be well prevented from entering the module, attenuation of the module is slowed down, and a service life of the module is prolonged. Therefore, the double-glass cell module according to the present disclosure has favorable weather resistance, high structural strength, a longer service life, and high ultraviolet absorbance.

In another embodiment, the double-glass photovoltaic module according to the present disclosure may further include multiple fixing devices 5, where the multiple fixing devices 5 are disposed on a side surface, far from the cell group layer 13, of the second glass layer 15, configured to install the entire cell module in a position by using the fixing devices 5. Specifically, as shown in FIG. 2, four fixing devices 5 are stuck to the back of the cell module by using high strength assembly glue. Therefore, the fixing devices 5 can be fastened, by using screws, to a support (not shown in the figure) for fixing the cell module. Such an installation manner ensures that the cell module is more evenly stressed, thereby enhancing a capability of the module for load bearing, and making the module more secure and reliable.

As shown in FIG. 2, the fixing device 5 is provided with a locating member that is used for fastening the double-glass cell module to an external carrier. Optionally, four fixing devices 5 are provided and evenly distributed on a surface of the second glass layer 15, that is, the back of the entire cell module. Therefore, it may be convenient to install the entire cell module on an installation surface or in an installation support (not shown in the figure).

The following describes in detail with reference to FIG. 1 to FIG. 4 the frame in the double-glass photovoltaic module according to the embodiments of the present disclosure, where descriptions are provided by using an example in which three connection boxes are provided and disposed on the short side of the body.

As shown in FIG. 1, the frame 6 may be fixed to an outside of the periphery of the body 1 by using silica gel, butyl rubber, or a double faced adhesive tape. The frame 6 is formed to be a frame structure, and a cross section of the frame 6 has a U-shaped groove, where a groove opening width of the U-shaped groove is greater than a thickness of the body 1, so that the U-shaped groove covers an outer edge of the body 1.

Figure 3:
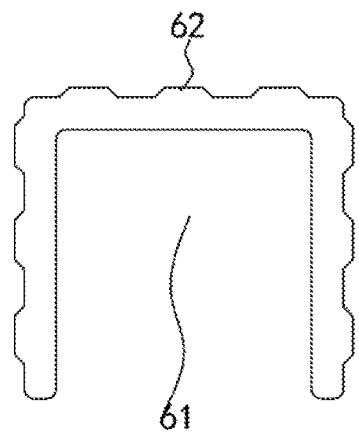
FIG. 3 is a cross-sectional schematic view of a frame of the double-glass photovoltaic module shown in FIG. 1.
Figure 4:
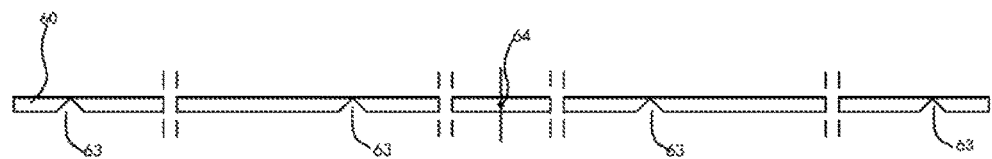
FIG. 4 is an exploded schematic view of a frame in FIG. 2.

Optionally, a thickness of the frame 6 is 1-2 mm, that is, a thickness of each side of the U-shaped groove of the frame 6 is 1-2 mm. In some embodiments, a convex bar 62 is formed on an outer surface the frame 6, as shown in FIG. 3. Optionally, the convex bar 62 extends along a length direction of the frame 6. Further, the convex bar 62 extends along a length direction of the frame 6 in a straight line or in a curved line, or may be extended, for example, spirally. By means of disposing the convex bar, entire strength of the frame 6 can be enhanced, and appearance of the frame 6 is more beautiful.

The frame 6 is an integrated frame formed by bending an encapsulation bar. Specifically, the encapsulation bar is a continuous conductor, where the encapsulation bar has at least two predetermined bending positions, a V-shaped groove 63 of 90 degrees is formed in each predetermined bending position, and the encapsulation bar is provided with a grounding hole 64. A reason for using a continuous frame conductor is: if each segment of side of the frame conductor is not continuous, when the cell module is installed, each segment of the side needs to be grounded, which increases costs, and makes installation difficult. Preferably, a diameter of the grounding hole 64 is 2-4 mm. Moreover, by means of the encapsulation bar formed with three V-shaped grooves 63 of 90 degrees in a predetermined right angle position, the V-shaped grooves 63 can be directly formed through bending during installation. In this way, the bended V-shaped grooves 63 of 90 degrees exactly form corners of the frame.

When the frame 6 and the connector 4 are both insulated polymer material members, the frame 6 does not need to be provided with a grounding hole 64 and multiple V-shaped grooves 63; instead, a required size is directly cut out for installation by segmentations, that is, the frame 6 is sequentially connected to the connector 4.

In addition, in some embodiments, the first encapsulation layer 12 and the second encapsulation layer 14 are transparent silica-gel layers or polyolefin layers, which therefore, compared with a conventional EVA encapsulation film, have an advantage of being capable of letting an ultraviolet light absorbed by an EVA ultraviolet absorber run through, and then the run through ultraviolet light may be converted into electrical energy, thus to increase outputs of the photovoltaic cell module. Moreover, a transparent silica-gel layer or a polyolefin layer is stable under the ultraviolet light, which may not be degraded to produce a small molecule such as acetic acid to erode a cell, and may have better weather resistance performance. Specifically, transparent silica gel is of a film-shaped structure, is thermoplastic, is in a solid state at ordinary temperature, and is gradually softened after elevation of temperature. Because transparent liquid silica gel is bi-component silica gel, and is in a liquid state at ordinary temperature, after two components are uniformly mixed with a ratio of 1:1 and laminated at 70-130 □, thermosetting transparent silica gel may be obtained by curing under a low laminating temperature, which may save energy and help to prolong a service life of a laminating machine. A backplane and a front plate of a double-glass module are both rigid glass, on which gluing and lamination are easier to be performed than a conventional backplane of polymer materials. When the first encapsulation layer 12 and the second encapsulation layer 14 are polyolefin layers, the polyolefin layers are thermosetting polyolefin layers or thermoplastic polyolefin layers. In actual use, the temperature of the module may reach 80-100 □, a thermoplastic film is softened and has particular fluidity, but a thermosetting film does not have such a problem; therefore, heat resistance performance of the module is better.

The double-glass photovoltaic module according to the present disclosure has favorable weather resistance, high structural strength, a longer service life, and high ultraviolet absorbance.

In the descriptions of this specification, a description of a reference term such as "an embodiment", "some embodiments", "exemplary embodiments", "examples", "specific examples", or "some examples" means that a specific feature, structure, material, or characteristic that is described with reference to the embodiment or the example is included in at least one embodiment or example of the present disclosure. In this specification, exemplary descriptions of the foregoing terms do not necessarily refer to a same embodiment or example. In addition, the described specific feature, structure, material, or characteristic may be combined in a proper manner in any one or more embodiments or examples.

Although the embodiments of the present disclosure have been shown and described, a person of ordinary skill in the art can understand that multiple changes, modifications, replacements, and variations may be made to these embodiments without departing from the principle and purpose of the present disclosure. The scope of the present disclosure is subject to the claims and equivalents thereof.

What is claimed is:

1. A double-glass photovoltaic module, comprising:
   a body, comprising a first glass layer, a first encapsulation layer, a cell group layer, a second encapsulation layer, and a second glass layer that are sequentially disposed in a laminated manner, wherein the cell group layer extracts a current by a bus bar, and the bus bar is led out between the first glass player and the second glass layer and from an edge of the body;
   a frame, encapsulated at a periphery of the body, and having a notch; and
   a connection box, disposed at the notch, sealed and connected to the body and the frame, and the bus bar is electrically connected to the connection box;
   wherein the connection box comprises a case having a chamber and at least two partition plates dividing the chamber into at least three sub-chambers;

at least two threading holes are formed on side walls of two outermost sub-chambers of the at least three sub-chambers, and the bus bar runs through the at least two threading holes to enter the chamber.

2. The double-glass photovoltaic module according to claim 1, wherein multiple connection boxes are provided and spaced from one another, every two adjacent connection boxes are connected by an encapsulation connector, and the encapsulation connector encapsulates an outer edge, corresponding to the notch, of the body.

3. The double-glass photovoltaic module according to claim 2, wherein the frame is an aluminum part, the encapsulation connector is an insulator, and the frame is provided with a grounding hole.

4. The double-glass photovoltaic module according to claim 2, wherein the frame and the encapsulation connector are both aluminum parts, and each encapsulation connector between every two adjacent connection boxes is provided with one grounding hole.

5. The double-glass photovoltaic module according to claim 2, wherein the frame is an insulator, and the encapsulation connector is an insulator.

6. The double-glass photovoltaic module according to claim 1, wherein the body and the frame are both formed as rectangles, and the notch is provided on a short side of the frame.

7. The double-glass photovoltaic module according to claim 1, wherein the connection box is clamped to an outer edge of the body, and sealed and connected to the frame by a sealant.

8. The double-glass photovoltaic module according to claim 7, wherein the connection box is glued to the first glass layer and the second glass layer.

9. The double-glass photovoltaic module according to claim 7, wherein two clamping feet are disposed at one side, facing the body, of the connection box, and clamped to the outer edge of the body.

10. The double-glass photovoltaic module according to claim 1, further comprising a surface mount thin sheet diode, wherein the thin sheet diode is welded to the bus bar and is laminated between the first glass layer and the second glass layer.

11. The double-glass photovoltaic module according to claim 1, wherein the frame is formed to be a frame structure, and a cross section of the frame has a U-shaped groove, wherein a groove opening width of the U-shaped groove is greater than a thickness of the body, so that the U-shaped groove covers an outer edge of the body.

12. The double-glass photovoltaic module according to claim 11, wherein the frame is an integrated frame formed by bending an encapsulation bar.

13. The double-glass photovoltaic module according to claim 12, wherein a thickness of the frame is 1-2 mm, and the frame is fastened to the periphery of the body by using silica gel, butyl rubber, or a double faced adhesive tape.

14. The double-glass photovoltaic module according to claim 12, wherein a convex bar is formed on an outer surface of the frame, wherein the convex bar extends along a length direction of the frame.

15. The double-glass photovoltaic cell module according to claim 1, wherein the at least three sub-chambers comprise two outermost sub-chambers and a middle sub-chamber, and a diode is disposed inside the middle sub-chamber.

16. The double-glass photovoltaic cell module according to claim 15, wherein the connection box further comprises a conductive block disposed inside the chamber and running through the at least three sub-chambers, and the bus bar is welded with conductive block.

17. The double-glass photovoltaic cell module according to claim 16, wherein the diode is connected to the conductive block.

* * * * *